(12) United States Patent
Sei et al.

(10) Patent No.: US 6,410,972 B1
(45) Date of Patent: Jun. 25, 2002

(54) STANDARD CELL HAVING A SPECIAL REGION AND SEMICONDUCTOR INTEGRATED CIRCUIT CONTAINING THE STANDARD CELLS

(75) Inventors: Toshikazu Sei; Hiroaki Suzuki; Toshiki Morimoto, all of Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/665,943

(22) Filed: Sep. 21, 2000

(30) Foreign Application Priority Data

Sep. 22, 1999 (JP) .............................. 11-269484

(51) Int. Cl.[7] .............................................. H01L 29/00
(52) U.S. Cl. ........................ 257/499; 257/202; 257/206; 257/500; 257/559; 257/725; 257/730
(58) Field of Search ................................. 257/499, 500, 257/559, 725, 730, 206, 202

(56) References Cited

U.S. PATENT DOCUMENTS 5,369,596 A * 11/1994 Tokumaru .................... 364/491

FOREIGN PATENT DOCUMENTS

| JP | 62072143 A | * | 4/1987 |
| JP | 01278743 A | * | 11/1989 |
| JP | 3-222457 | | 10/1991 |
| JP | 2761052 | | 3/1998 |

* cited by examiner

Primary Examiner—Nathan Flynn
Assistant Examiner—Remmon R. Fordé
(74) Attorney, Agent, or Firm—Finnegan, Henderson, Farabow, Garrett & Dunner, L.L.P.

(57) ABSTRACT

The present invention provides a standard cell which can reduce an effective cell size and improve an integration degree of a semiconductor integrated circuit. The standard cell includes a plurality of MOS transistors formed on a semiconductor substrate. Then, a plurality of standard cells are adjacent to each other in upper, lower, left and right directions, and constitute the semiconductor integrated circuit. The present invention is intended to reduce the effective cell size in such a way that a source region of a MOS transistor connected to a power supply voltage or a ground voltage is shared between cells adjacent to each other. Also, even if the source region is not shared, a source region of one cell in the cells adjacent to each other is arranged in an empty space region of the other cell in such a way that it bestrides between the cells adjacent to each other.

18 Claims, 7 Drawing Sheets

FIG.1A
FIG.1C
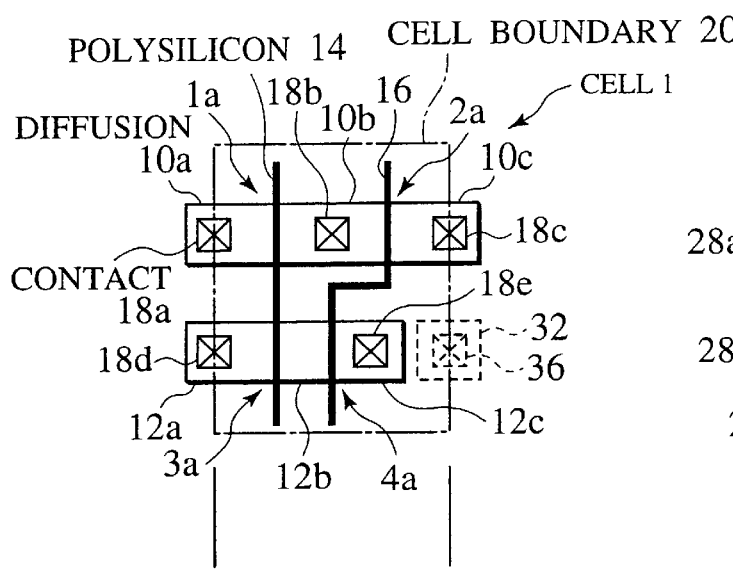
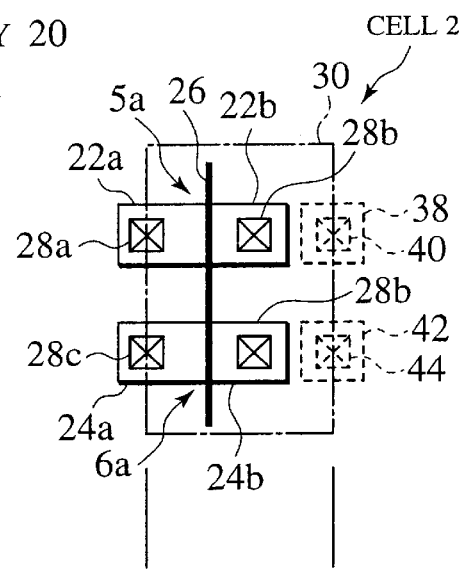
FIG.1B
PRIOR ART
FIG.1D
PRIOR ART

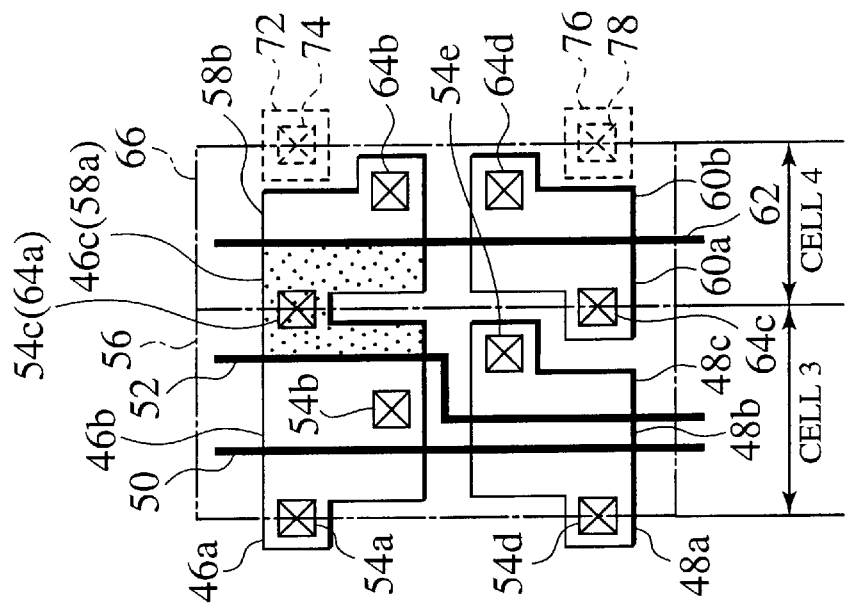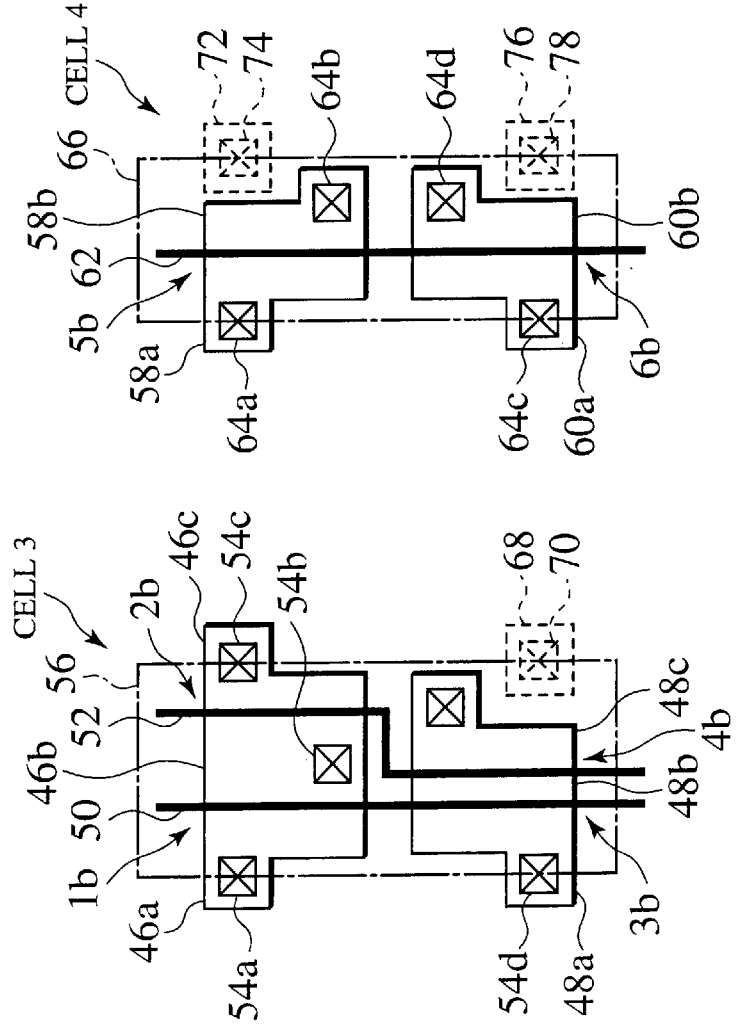

STANDARD CELL HAVING A SPECIAL REGION AND SEMICONDUCTOR INTEGRATED CIRCUIT CONTAINING THE STANDARD CELLS

CROSS REFERENCE TO THE RELATED APPLICATION

The subject application is related to subject matter disclosed in the Japanese Patent Application No.Hei11-269484 filed in Sep. 22, 1999 in Japan, to which the subject application claims priority under the Paris Convention and which is incorporated by reference herein.

BACKGROUND OF THE INVENTION

1. Field of the Invention

The present invention relates to a standard cell and a semiconductor integrated circuit attained by a combination of the standard cells.

2. Description of the Related Art

Associated with a growth of a large scale of a semiconductor integrated circuit, it becomes difficult to completely design by only a man power. For this reason, a semi-custom design method for an automatic design through a computer has been typically used. This semi-custom design method is a method for preparing a plurality of standard basic circuits (logical cells) in advance, automatically designing those logical cells by using the computer, and then developing a desirable circuit. As a typical example of the method, there are a gate array method and a standard cell method.

In the standard cell method, a slightly complex logic circuit generated by a combination of basic circuits is optimally designed in advance, and stored as a cell in a database of the computer. When LSI is actually designed, the desirable circuit is attained by a combination of various cells stored in the database. The respective cells are constant in height, and the necessary cells are arranged in a plurality of rows. The database for storing the cells is referred to as a cell library. As kinds of cells stored in this cell library are richer, it is possible to design an LSI chip with smaller waste.

In recent years, a cell base ASIC in which a standard cell and a macro cell (block) of a high function can be mixed has been used as a main method for semi-custom design. Especially, a cell base ASIC using a standard cell is developed in which a cell region (transistor region) and a wiring cannel region are mixed. The expectation is growing for its high integration degree.

On the other hand, associated with increase in an integration density of the semiconductor integrated circuit, the miniaturization of a cell size has been required more and more. Typically, if a transistor size is reduced in each cell, it is possible to reduce the cell size. However, the equal reduction in the transistor size causes a drive performance of the cell to be dropped. In the standard cell method, the respective cells are arranged in a plurality of rows. So, there may be a case of a circuit configuration sharable between cells adjacent to each other. Thus, if the circuit configuration is collected into one, the cell row can be reduced to thereby reduce the apparent cell size. As a conventionally used method, there is a method in which a substrate contact region for applying a potential to a substrate (in a case of a well structure, the well) is mounted at a center of cells adjacent to each other in an upper and lower direction, and then the substrate contact region is shared between the cells. However, in this method, even if the cell row can be reduced in the upper and lower direction, it is naturally impossible to reduce in a left and right direction. Hence, it is desirable to attain a method for reducing the cell row even in the left and right direction and effectively reduce the cell size.

SUMMARY OF THE INVENTION

The present invention is proposed in view of the above mentioned circumstances. It is therefore an object of the present invention to reduce an effective cell size both in an upper and lower direction and in a left and right direction and thereby provide a standard cell for improving an integration density of a semiconductor integrated circuit.

Another object of the present invention is to provide a semiconductor integrated circuit which can be attained by a combination of the above-mentioned standard cells and highly integrated.

Still another object of the present invention is to provide a method for designing a semiconductor integrated circuit, which can be attained by the combination of the above-mentioned standard cells and highly integrated.

In order to solve the above-mentioned problems, the feature of the present invention lies in a standard cell having a plurality of MOS transistors formed on a semiconductor substrate, in which the standard cells are adjacent to each other in upper, lower, left and right directions and constitute a semiconductor integrated circuit, the standard cell further comprising: (a) a boundary line between cells adjacent to each other; and (b) a special region, wherein the special region has at least one of a source region which is arranged beyond the boundary line and connected to a power source for applying a predetermined potential on the semiconductor substrate, and an empty space region arranged near the boundary line, in which when an adjacent cell has a source region beyond the boundary line, the source region of the adjacent cell can be mounted.

According to the feature of the present invention, a source pattern region (a source diffusion layer and a contact above it) is shared between cells adjacent to each other. Thus, a cell row can be reduced in an upper and lower direction and in a left and right direction. Even if there is no shared source pattern region, it is allowable to arrange any one source pattern region of the cells adjacent to each other while it bestrides between the cells adjacent to each other. Even this case enables the reduction in the cell row. Such a reduction in the cell row enables the reduction in an effective size of a cell, the reduction in a chip size and an improvement of an integration density.

According to the feature of the present invention, a contact pattern region (a substrate contact pattern region) for applying a potential to a semiconductor substrate or a well may be arranged such that it overlaps with a source region formed beyond a cell boundary line. In this case, the cell row can be further reduced.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 1A is a plan view showing a standard cell constituting a two-input NAND according to a first embodiment of the present invention;

FIG. 1B is a plan view showing a standard cell constituting a two-input NAND according to a conventional technique which is a comparison example with FIG. 1A;

FIG. 1C is a plan view showing a standard cell constituting an inverter according to the first embodiment of the present invention;

FIG. 1D is a plan view showing a standard cell constituting an inverter according to a conventional technique which is a comparison example with FIG. 1C;

FIG. 3A is a plan view showing a standard cell constituting a two-input NAND according to a second embodiment of the present invention;

FIG. 3B is a plan view showing a standard cell constituting an inverter according to the second embodiment of the present invention;

FIG. 3C is a plan view showing a case in which a NAND cell in FIG. 3A and an inverter cell in FIG. 3B are arranged adjacently to each other;

DETAILED DESCRIPTION OF THE INVENTION

Figure 2A:
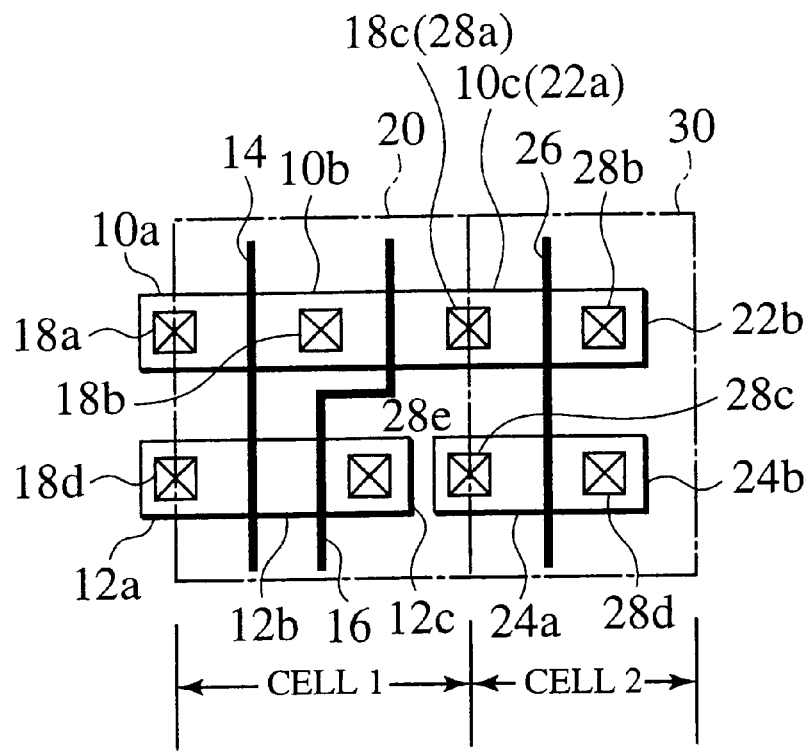
FIG. 2A is a plan view showing a case in which a NAND cell in FIG. 1A and an inverter cell in FIG. 1C are arranged adjacently to each other.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

At first, a standard cell according to the present invention is described by using four embodiments. An apparatus for and a method of designing a semiconductor integrated circuit, according to the present invention, is described in succession.

(First Embodiment)

FIGS. 1A to 1D are views describing a first embodiment of the present invention. FIG. 1A is a plan view showing a standard cell constituting a two-input NAND according to the first embodiment. FIG. 1B is a plan view showing a standard cell constituting a two-input NAND according to a conventional technique which is a comparison example with FIG. 1A. FIG. 1C is a plan view showing a standard cell constituting an inverter according to the first embodiment. And, FIG. 1D is a plan view showing a standard cell constituting an inverter according to a conventional technique which is a comparison example with FIG. 1C. In FIGS. 1A to 1D, only (a) a source drain diffusion layer, (b) a poly-silicon, (c) a contact, and (d) a cell boundary line (cell frame) are shown for the purpose of simple illustration, and a metallic wiring layer is omitted. Although not shown, a substrate contact region for applying a potential to a substrate or a well is shared between cells adjacent to each other in an upper and lower direction, similarly to the conventional technique. Also, the respective cells are arranged adjacently to each other in upper, lower, left and right directions so that their cell boundary lines are in contact with each other. Cell rows extending in the upper and lower direction and in the left and right direction are formed.

As shown in FIG. 1A, a standard cell 1 constituting a two-way NAND according to the first embodiment is provided with source drain diffusion layers 10 (10a, 10b and 10c), 12 (12a, 12b and 12c) for constituting a plurality of p-type MOS transistors and a plurality of n-type MOS transistors, poly-silicons 14, 16, contacts 18 (18a, 18b, 18c, 18d and 18e) and a cell boundary line 20. This standard cell 1 is provided with two p-type MOS transistors 1a, 2a and two n-type MOS transistors 3a, 4a. The p-type MOS transistor 1a has the poly-silicon 14 serving as a gate, the p-type diffusion layer 10a serving as a source region, and the p-type diffusion layer 10b serving as a drain region shared by the p-type MOS transistor 2a. Similarly, the p-type MOS transistor 2a has the poly-silicon 16 serving as a gate, the p-type diffusion layer 10c serving as a source region, and the p-type diffusion layer 10b serving as a drain region shared by the p-type MOS transistor 1a. A power supply voltage (VDD) is supplied through the contacts 18a, 18c to the source diffusion layer 10a, 10c of the p-type MOS transistors 1a, 2a, respectively. Also, the p-type MOS transistors 1a, 2a are connected in parallel.

On the other hand, the n-type MOS transistor 3a has the poly-silicon 14 serving as a gate, the n-type diffusion layer 12a serving as a source region and the n-type diffusion layer 12b serving as a drain region. Similarly, the n-type MOS transistor 4a has the poly-silicon 16 serving as a gate, the n-type diffusion layer 12b serving as a source region and the n-type diffusion layer 12c serving as a drain region. The n-type diffusion layer 12b is used as both the drain region in the n-type MOS transistor 3a and the source region in the n-type MOS transistor 4a. A ground voltage (VSS) is supplied through the contact 18d to the n-type diffusion layer 12a in the n-type MOS transistor 3a. The n-type MOS transistors 3a, 4a are connected in series.

Then, the p-type diffusion layer 10b and the n-type diffusion layer 12c are connected by a metallic wiring layer (not shown) through the contact 18b mounted above the shared drain diffusion layer 10b between the p-type MOS transistors 1a, 2b and the contact 18e mounted above the drain diffusion layer 12c in the n-type MOS transistor 4a.

As shown in FIG. 1C, a standard cell 2 constituting an inverter according to the first embodiment of the present invention is provided with source drain diffusion layers 22 (22a, 22b), 24 (24a, 24b) for constituting a p-type MOS transistor and an n-type MOS transistor, a poly-silicon 26, contacts 28 (28a, 28b, 28c and 28d) and a cell boundary line 30. This standard cell 2 is provided with one p-type MOS transistors 5a and one n-type MOS transistor 6a. The p-type MOS transistor 5a has the poly-silicon 26 serving as a gate, the p-type diffusion layer 22a serving as a source drain, and the p-type diffusion layer 22b serving as a drain region. The power supply voltage (VDD) is supplied through the contact 28a to the diffusion layer 22a in the p-type MOS transistor 5a. On the other hand, the n-type MOS transistor 6a has the poly-silicon 26 serving as a gate, the n-type diffusion layer 24a serving as a source region, and the n-type diffusion layer 24b serving as a drain region. The ground voltage (VSS) is supplied through the contact 28c to the n-type diffusion layer 24a in the n-type MOS transistor 6a. Then, the two drain diffusion layers 22b, 24b are connected by a metallic wiring layer (not shown) through the contact 28b mounted above the drain diffusion layer 22b in the p-type MOS transistor 5a and the contact 28d mounted above the drain diffusion layer 24b in the n-type MOS transistor 6a.

As can be understood from FIGS. 1A and 1B, the NAND cell 1 in FIG. 1A is different from a cell 1' having the conventional configuration shown in FIG. 1B, in a fact that parts of the source diffusion layers 10a, 10c and 12a and the contacts 18a, 18c and 18d above them are arranged beyond the cell boundary line 20. The NAND cell 1 has the space in which parts of a source diffusion layer 32 of another cell (not shown) adjacent to the NAND cell 1 and a contact 36 above it can be arranged.

Similarly, an inverter cell 2 in FIG. 1C is different from a conventional cell 2' shown in FIG. 1D, in a fact that parts of the source diffusion layers 22a, 24a and the contacts 28a, 28c above them are arranged beyond the cell boundary line 30 and in a fact that space is arranged so as to mount parts of source diffusion layers 38, 42 of adjacent other cells (not shown) and the contacts 36, 44 above them. Really, those facts are the features in the present invention. The configurations in FIGS. 1A and 1C enable the apparent cell size to be reduced in the left and right direction.

Figure 2B:
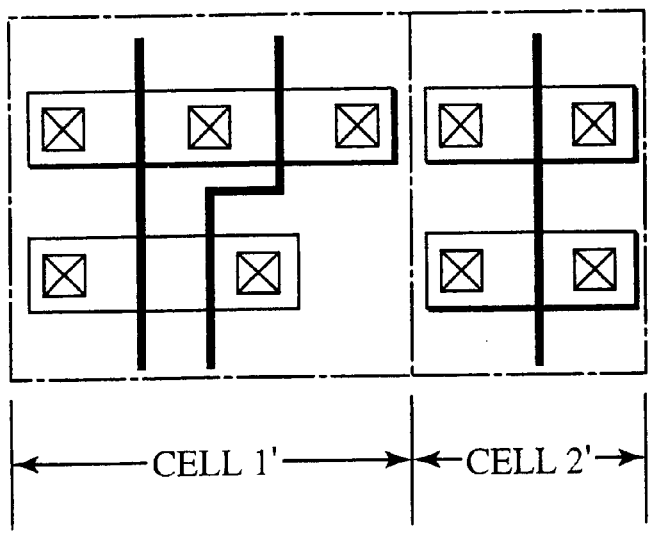
FIG. 2B is a plan view showing a case in which a NAND cell in FIG. 1B and an inverter cell in FIG. 1D are arranged adjacently to each other.

That is, in the standard cells 1, 2 according to the first embodiment of the present invention in FIGS. 1A and 1C, parts of the source regions that can be shared between cells adjacent to each other (the source diffusion layers 10a, 10c, 12a, 22a and 24a, and their contacts 18a, 18c, 18d, 28a and 28c) are designed in advance so as to be located beyond the cell boundary lines 20, 30. Also, the spaces in which parts of source regions (the source diffusion layers 32, 38 and 42, and their contacts 36, 40 and 44) located beyond adjacent other cells can be mounted in the standard cells 1, 2. As shown in FIG. 2A, when the NAND cell 1 in FIG. 1A and the inverter cell 2 in FIG. 1C are arranged adjacently to each other, the source diffusion layer 10C in FIG. 2A and the contact 18c above it and the source diffusion layer 22a in FIG. 1C and the contact 28a above it are collected into one. In short, they are shared between those cells 1, 2. Also, parts of the diffusion layer 24a and the contact 28c in FIG. 1C are arranged in the space of the NAND cell 1, as the contact 36 and the diffusion layer 32 in FIG. 1A. In short, in the first embodiment of the present invention, a cell row is reduced in the left and right direction since the source diffusion layer and the contact above it are shared between the cells adjacent to each other. Also, even if they are not shared, the cell row is reduced in the left and right direction since the source diffusion layer and its contact are arranged while bestriding the cells adjacent to each other. Thus, as can be understood from FIGS. 2A and 2B, the case (in FIG. 2A) in which the NAND cell 1 and the inverter cell 2 shown in FIGS. 1A and 1C according to the first embodiment of the present invention are arranged adjacently to each other can largely reduce the cell row in the left and right direction, as compared with the case (in FIG. 2B) in which a NAND cell 1' and an inverter cell 2' shown in FIGS. 1B and 1D according to the conventional technique are arranged adjacently to each other. Hence, the effective cell size can be reduced in the left and right direction to thereby reduce the chip area and improve the integration density.

In the first embodiment of the present invention, the space as mentioned above may be unnecessary if the following function is added to EDA (Electronic Design Automation). That is, an information as to whether or not the source diffusion layer and its contact are located beyond the cell boundary line is given to each cell. So, this is the function in which if a source region is not shared between a cell having the information and another cell adjacent to it, a space is mounted between the cells. However, since a load on the computer is made heavier, there may be a case that it is desirable to uniformly mount the above-mentioned spaces in all of the cells from the viewpoint of a reduction in a design period.

(Second Embodiment)

A second embodiment of the present invention will be described below. In the second embodiment of the present invention, the effective cell size with regard to the left and right direction is further reduced by arranging (1) the source diffusion layer and the contact above it which are located beyond the cell boundary line and (2) the space in which the source diffusion layer of the adjacent cell and its contact are mounted, in accordance with a predetermined standard, in the standard cell of the first embodiment shown in FIGS. 1A, 1B and 1C. The actual configuration will be described below.

In the standard cell 1 shown in FIG. 1A, the drain diffusion layer 12c and its contact 18e, and the space in which the source diffusion layer 32 of another cell adjacent to the standard cell 1 and its contact 36 are mounted are arranged in the left and right direction. This condition is similar even in the standard cell 2 shown in FIG. 1C.

So, the second embodiment of the present invention is configured such that within a cell boundary line, a drain diffusion layer and its contact, and a space in which a source diffusion layer of an adjacent cell and its contact are mounted are separately arranged in an upper and lower direction, differently from the first embodiment. This configuration enables the drain diffusion layer and its contact to be arranged near the cell boundary line, and further reduces the effective cell size in the left and right direction.

FIGS. 3A to 3C are views describing the second embodiment of the present invention. FIG. 3A is a plan view showing a standard cell constituting a two-input NAND according to the second embodiment. FIG. 3B is a plan view showing a standard cell constituting an inverter according to the second embodiment. And, FIG. 3C is a plan view showing a case in which the cell in FIG. 3A and the cell in FIG. 3B are adjacent to each other. In FIGS. 3A to 3C, only (a) a source drain diffusion layer, (b) a poly-silicon, (c) a contact, and (d) a cell boundary line (cell frame) are shown for the purpose of simple illustration, and a metallic wiring layer is omitted. Although not shown, the substrate contact region is shared between cells adjacent to each other in an upper and lower direction, similarly to the conventional technique. Also, the respective cells are arranged adjacently to each other in upper, lower, left and right directions so that their cell boundary lines are in contact with each other. Cell rows extending in the upper and lower direction and in the left and right direction are formed.

As shown in FIG. 3A, in a NAND cell 3 according to the second embodiment of the present invention, parts of source diffusion layers 46a, 46c and 48a, and contacts 54a, 54c and 54d above them are arranged beyond a cell boundary line 56. Then, the source diffusion layers 46a, 46c and 48a, and the contacts 54a, 54c and 54d above them are arranged above or below the cell, and a drain diffusion layer 48c and a contact 54e above it are arranged at a center of the cell. Moreover, depending on the above-mentioned arrangement of the source and the drain, a space in which a source diffusion layer 68 of an adjacent cell and a contact 70 above it can be mounted is arranged separately from the drain diffusion layer 48c and its contact 54e, in the upper and lower direction.

Similarly, in an inverter cell 4 of FIG. 3B, parts of source diffusion layers 58a, 60a and contacts 64a, 64c above them are arranged beyond a cell boundary line 66. Then, the source diffusion layers 58a, 60a and the contacts 64a, 64c above them are arranged above or below the cell, and drain diffusion layers 58b, 60b and contacts 64b, 64d above them are arranged at a center of the cell. Moreover, depending on the above-mentioned arrangement of the source and the drain, spaces in which source diffusion layers 72, 76 of adjacent cells and contacts 74, 78 above them can be mounted are arranged separately from the drain diffusion layers 58b, 60b and the contacts 64b, 64d above them in the upper and lower direction.

As shown in FIG. 3C, when the NAND cell 3 in FIG. 3A and the inverter cell 4 in FIG. 3B are arranged adjacently to each other, the source diffusion layer 46c in FIG. 3A and the contact 54c above it, and the source diffusion layer 58a in FIG. 3B and the contact 64a above it are collected into ones. In short, they are shared between those cells 3, 4. So, the source diffusion layer 46c (58a) shared between the cells 3, 4 and the contact 54c (64a) above it have the shape including at least concave. Also, parts of the portions beyond the diffusion layer 60a and the contact 64c are arranged in the space of the cell 3, as the diffusion layer 68 and the contact 70 in FIG. 3A.

According to the second embodiment of the present invention, the space in which the parts of the source diffusion layer of the adjacent cell and its contact can be mounted, and the drain diffusion layer and its contact are arranged separately in the upper and lower direction. Thus, the cell row can be reduced in the left and right direction, and the effective size of the cell can be further reduced. Hence, it is possible to reduce the chip area and improve the integration density (Third Embodiment)

A third embodiment of the present invention will be described below. In the first and second embodiments, the substrate contact region for applying the potential to the substrate or the well is shared between the cells adjacent to each other in the upper and lower direction. The third embodiment of the present invention is intended to reduce the cell row in both the upper and lower direction and the left and right direction as a whole, without additionally mounting the substrate contact region in the upper and lower direction, since the substrate contact region is shared between cells adjacent to each other in the left and right direction. Accordingly, it is intended to reduce the effective cell size in the upper and lower direction and in the left and right direction, reduce the chip area and improve the integration density.

Figure 4:
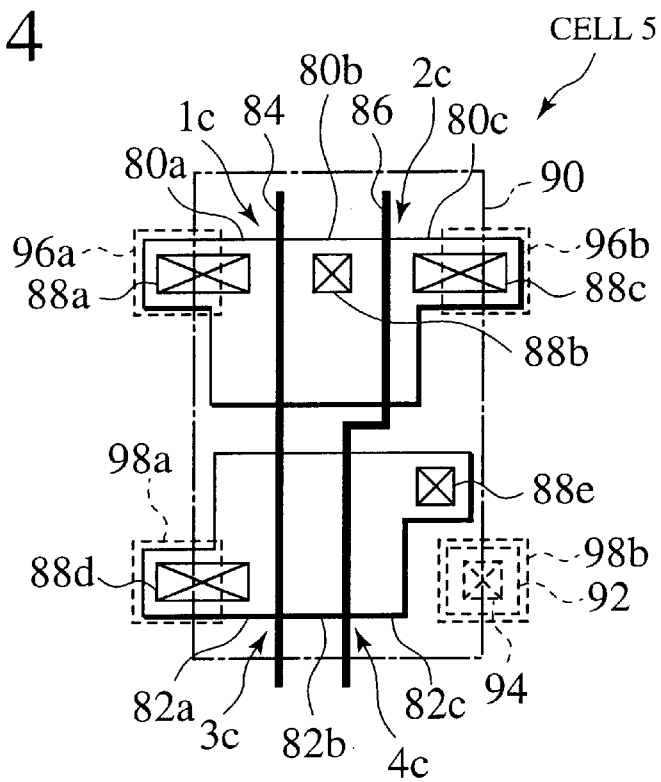
FIG. 4 is a plan view showing a standard cell constituting a two-input NAND according to a third embodiment of the present invention.

FIG. 4 is a plan view showing a standard cell constituting a two-input NAND according to the third embodiment of the present invention. In FIG. 4, only (a) a source drain diffusion layer, (b) a poly-silicon, (c) a contact, (d) a cell boundary line (cell frame) and (e) a substrate contact region are shown for the purpose of simple illustration, and a metallic wiring layer is omitted. Also, the respective cells are arranged adjacently to each other in upper, lower, left and right directions so that their cell boundary lines are in contact with each other. Cell rows extending in the upper and lower direction and in the left and right direction are formed.

As shown in FIG. 4, in a NAND cell 5 according to the third embodiment, parts of source diffusion layers 80a, 80c and 82a, and contacts 88a, 88c and 88d above them are arranged beyond a cell boundary line 90. The source diffusion layers 80a, 80c and 82a, and the contacts 88a, 88c and 88d above them are arranged above or below the cell, and a drain diffusion layer 82c and a contact 88e above it are arranged at a center of the cell. Moreover, depending on the above-mentioned arrangement of the source and the drain, a space in which a source diffusion layer 92 of an adjacent cell and a contact 94 above it can be mounted is arranged separately from the drain diffusion layer 82c and its contact 88e, in the upper and lower direction.

The explanations until the above-mentioned block are similar to those of the first and second embodiments in the present invention. In the third embodiment of the present invention, substrate contact regions 96a, 96b and 98a can be shared between cells adjacent to each other in the left and right direction by arranging the substrate contact regions 96a, 96b and 98a in the left and right direction. Moreover, this third embodiment is configured such that the substrate contact regions 96a, 96b and 98a, and the source diffusion layers 80a, 80c and 82a overlap with each other and that they are connected to each other through the contacts 88a, 88c, 88d, respectively. Even in a case that the source diffusion layer 92 of the adjacent cell, the contact 94 and the substrate contact region 98b are arranged, this has the same configuration.

For example, the source diffusion layers 80a, 80c constituting the p-type MOS transistors 1c, 2c are constituted by p-type impurities such as boron (B) and the like, and the substrate contact regions 96a, 96b are constituted by n-type impurities such as phosphorus (P), arsenic (As) and the like. The contacts 88a, 88c are connected to both the source diffusion layers 80a, 80c serving as the p-type region and the substrate contact regions 96a, 96b serving as the n-type impurity region. By the way, the p-type impurities are not implanted into the portions overlapping with the substrate contact regions 96a, 96b, in the source diffusion layers 80a, 80c. Also in the source diffusion layers 82a constituting the n-type MOS transistor 3c, the contact 88d and the substrate contact region 98a, the inversion of their conductive types results in the configuration similar to the above-mentioned configuration.

The third embodiment of the present invention is configured such that the substrate contact region for applying the potential to the substrate or the well overlaps with the source diffusion layer shared between the left and right cells. Thus, the substrate contact region can be shared between the left and right cells. Moreover, one contact enables the source diffusion layer and the substrate contact region to be connected to each other. Hence, the cell row can be further reduced in the upper and lower direction and in the left and right direction, and the effective size of the cell can be further reduced. Accordingly, it is possible to reduce the chip area and improve the integration density.

(Fourth Embodiment)

A fourth embodiment of the present invention will be described below. In the first to third embodiments, the substrate contact region for applying the potential to the substrate or the well is shared by the cells adjacent to each other in any of the upper and lower direction and the left and right direction. Actually, it is shared between the cells adjacent to each other in the upper and lower direction, in the first and second embodiments. And, it is shared between the cells adjacent to each other in the left and right direction, in the third embodiment.

The fourth embodiment of the present invention is further intended to reduce the cell row in both the upper and lower direction and the left and right direction as a whole, since the substrate contact region is shared between cells adjacent to each other in the upper and lower direction and also between cells adjacent to each other in the left and right direction.

Accordingly, it is intended to reduce the effective cell size in both the upper and lower direction and the left and right direction, reduce the chip area and improve the integration density.

Figure 5:
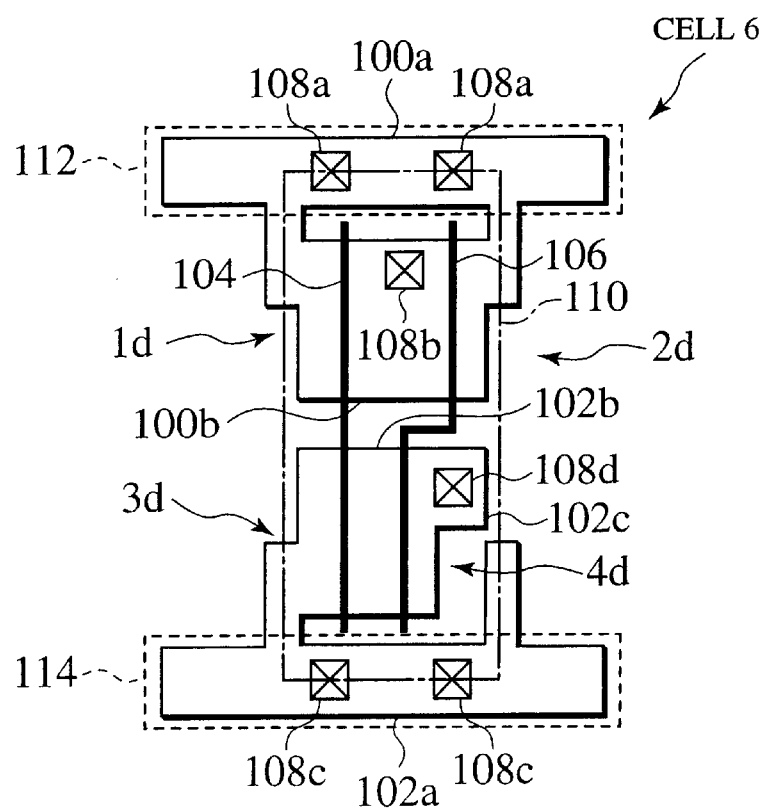
FIG. 5 is a plan view showing a standard cell constituting a two-input NAND according to a fourth embodiment of the present invention.

FIG. 5 is a plan view showing a standard cell constituting a two-input NAND according to the fourth embodiment of the present invention. In FIG. 5, only (a) a source drain diffusion layer, (b) a poly-silicon, (c) a contact, (d) a cell boundary line (cell frame) and (e) a substrate contact region are shown for the purpose of simple illustration, and a metallic wiring layer is omitted. Also, the respective cells are arranged adjacently to each other in upper, lower, left and right directions so that their cell boundary lines are in contact with each other. Cell rows extending in the upper and lower direction and in the left and right direction are formed.

As shown in FIG. 5, in a NAND cell 6 according to the fourth embodiment, parts of source diffusion layers 100a, 102a and contacts 108a, 108c above them are arranged beyond a cell boundary line 110. Then, the source diffusion layers 100a, 102a and the contacts 108a, 108c above them are arranged above or below the cell. A drain diffusion layer 102c and a contact 108d above it are arranged at a center of the cell. Also, substrate contact regions 112, 114 are arranged such that they overlap with the source diffusion layers 101, 102a above or below the cell. Moreover, the substrate contact regions 112, 114 and the source diffusion layers 100a, 102a have the shapes that they are extended in the left and right direction.

Figure 6:
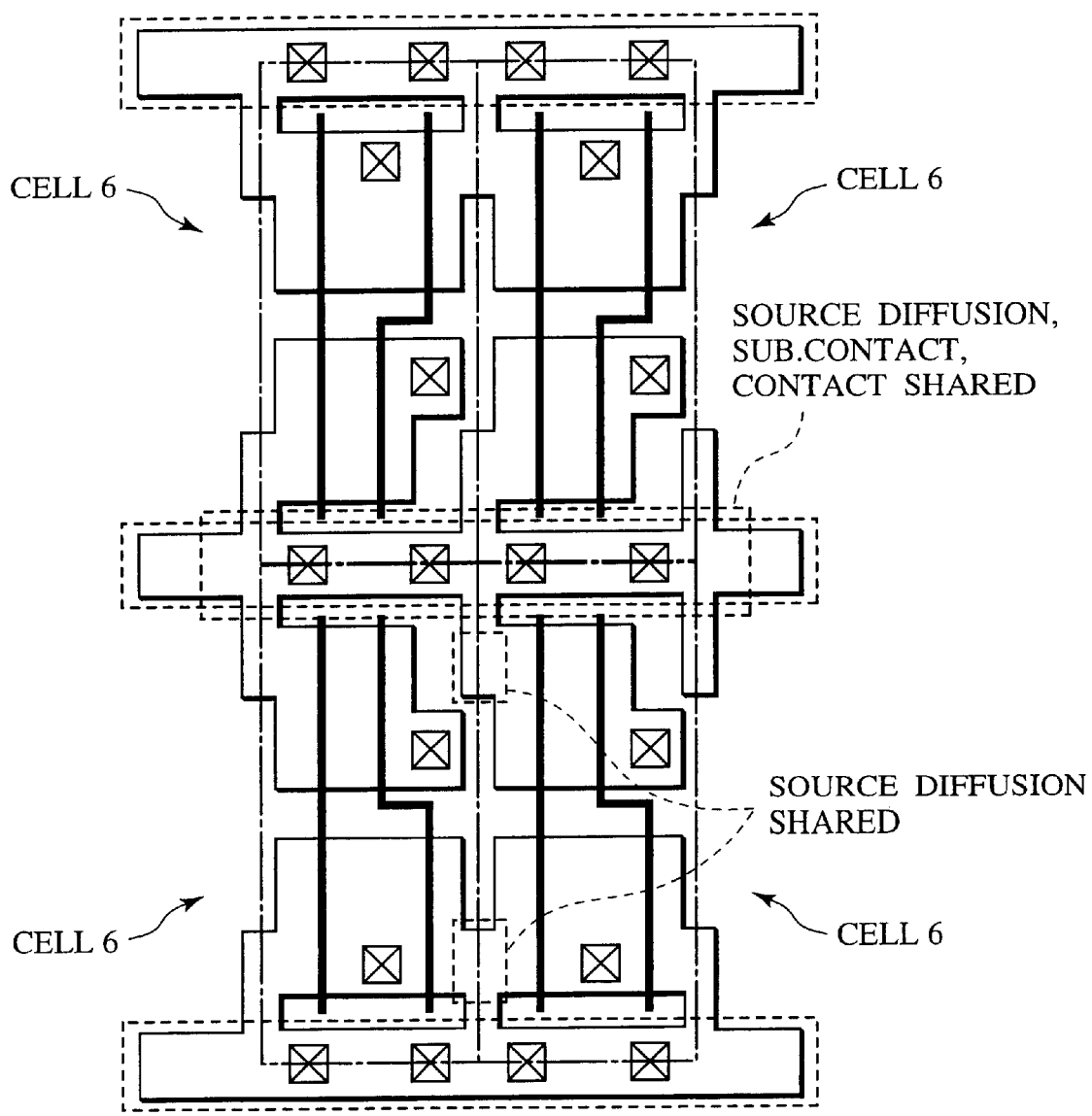
FIG. 6 is a plan view showing a case in which NAND cells in FIG. 5 are arranged adjacently to each other in upper, lower, left and right directions.

As shown in FIG. 6, if a plurality of cells are arranged in the upper, lower, left and right directions, the substrate contact regions 112, 114 and the source diffusion layers 100a, 102a are shared between both cells in the upper and lower direction and in the left and right direction. Thus, the cell row can be reduced in both the upper and lower direction and the left and right direction as a whole, and the effective cell size can be reduced in the upper and lower direction and in the left and right direction. Hence, it is possible to attain the reduction in the chip area and the improvement of the integration degree.

In the fourth embodiment of the present invention, the contacts 108a, 108c are mounted only above the substrate contact regions 112, 114 to thereby drop the number of contacts. That is, the contacts 108a, 108c and the source diffusion layers 100a, 102a are not directly connected to each other, and they are indirectly connected to each other through conductive layers (not shown) having low resistances formed on the source diffusion layers 100a, 102a. Thus, the contacts 108a, 108c can be shared between the cells adjacent to each other in the upper and lower direction. Hence, it is possible to drop the number of contacts. The conductive layers on the source diffusion layers 100a, 102a may be attained by using, for example, a known salicide process. (Apparatus for And Method of Designing Semiconductor Integrated Circuit)

Figure 7:
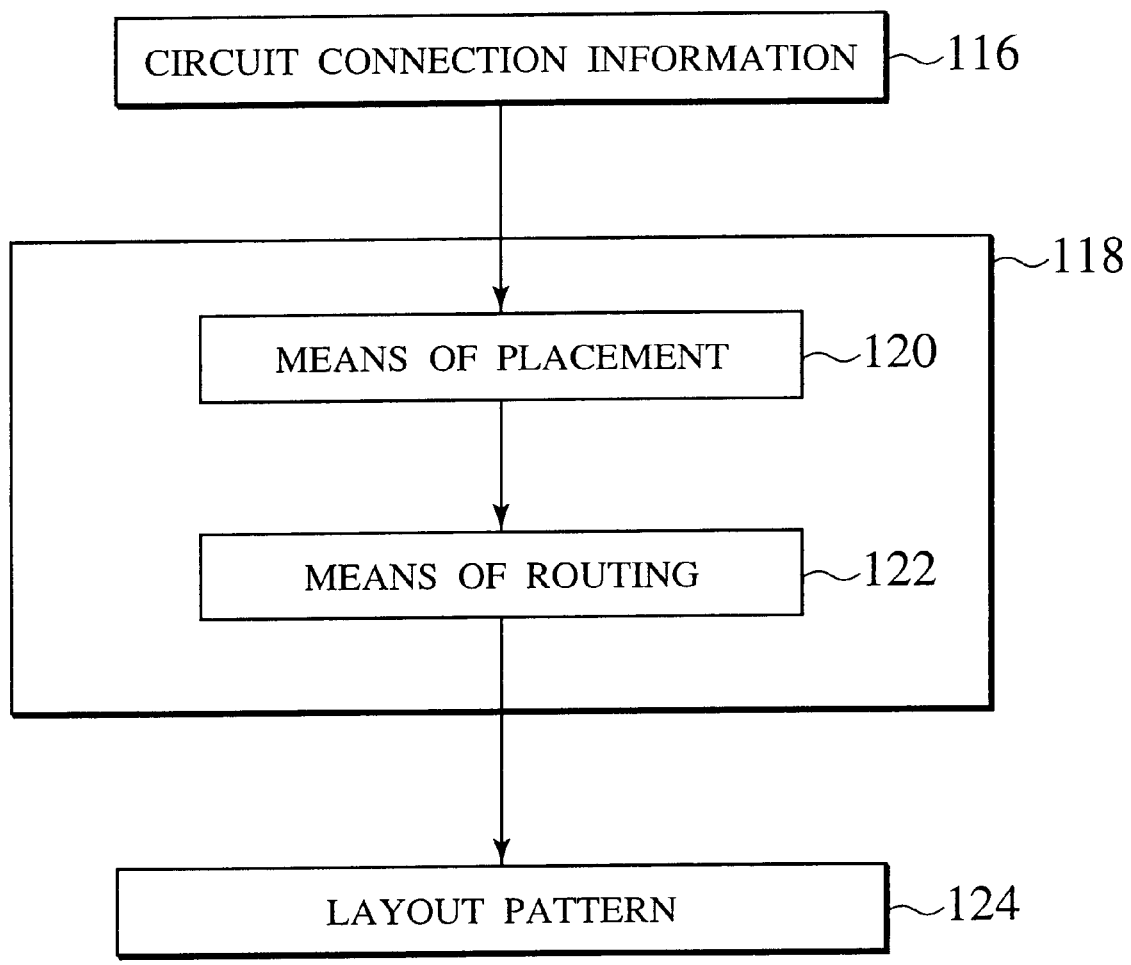
FIG. 7 is a block diagram showing an apparatus for designing a semiconductor integrated circuit, according to the present invention.
Figure 8:
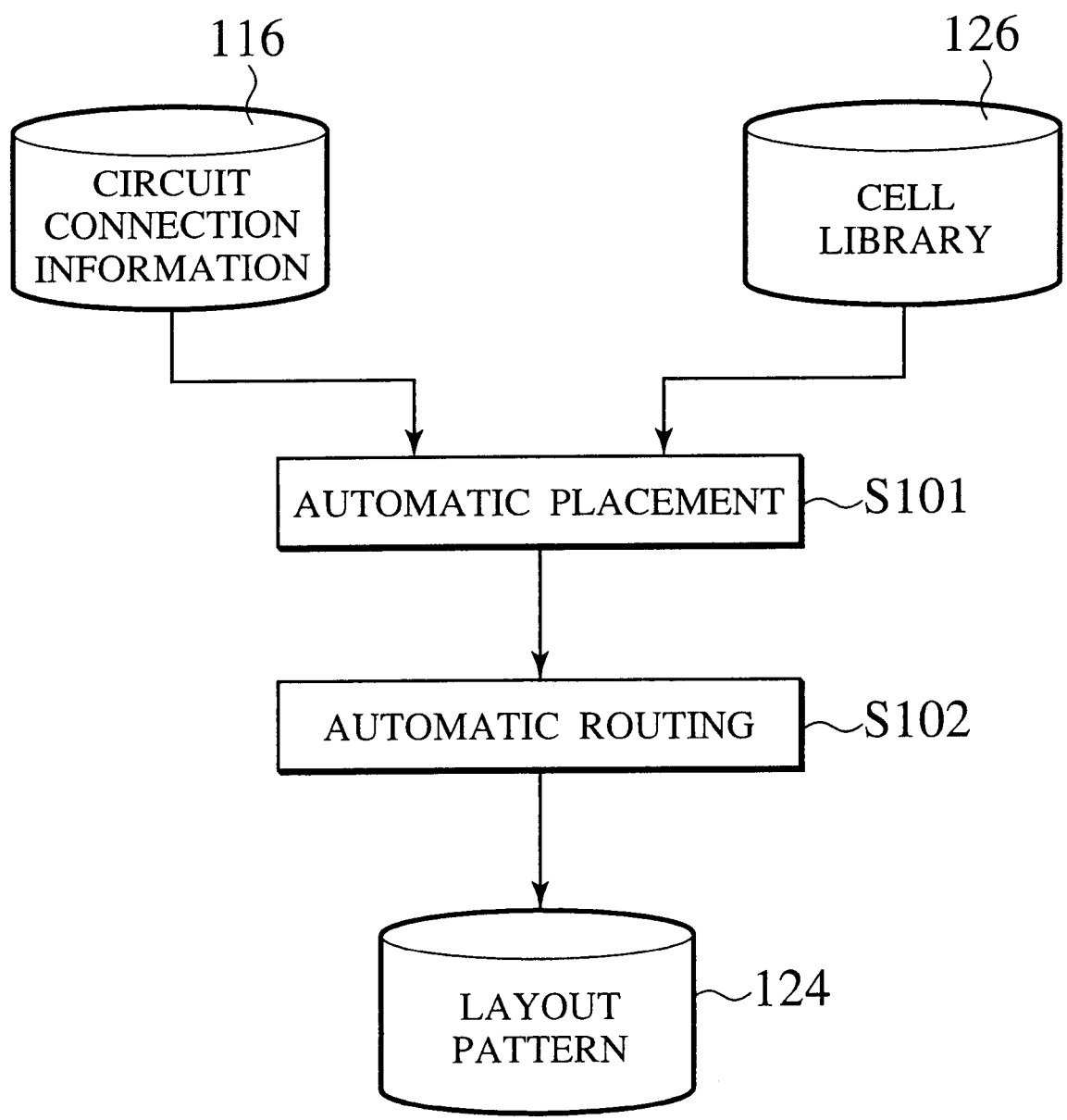
FIG. 8 is a flowchart showing a basically processing procedure of a method for designing a semiconductor integrated circuit according to the present invention.

FIG. 7 is a block diagram showing an apparatus for designing a semiconductor integrated circuit, according to the present invention. FIG. 8 is a flowchart showing a basically processing procedure of a method of designing a semiconductor integrated circuit, according to the present invention. As shown in FIG. 7, a designing apparatus 118 according to the present invention is provided with a device 120 for mounting the standard cells, the high function blocks (macro cells) and the like, and a device for determining a wiring route between the mounted cells. The designing apparatus 118 according to the present invention receives a circuit connection information 116 composed of connection information with regard to a plurality of circuits, and outputs a layout block (pattern) 124 which is a layout result.

The designing method according to the present invention will be described below with reference to FIG. 8. As shown in FIG. 8, the circuit connection information 116 and a cell library data 126 are entered at a step S101. Those data are stored on, for example, a memory of a computer. A connection data between circuits generated by a logical design (a net list) is outputted as the circuit connection information 116 from a logical circuit database or the like, after the end of the logical design. The circuit connection information 116 notes a cell name, a terminal name and a signal name, and represents a connection information between circuits. Terminals in which the same signal names are noted are connected through wiring. Then, the cells noted in the circuit connection information 116 are selected from the cell library data 126 to thereby arrange a plurality of cells. How effectively the cells can be arranged in an optimal state is very important in the arranging process. This is because the arrangement of the standard cells has enormous influence on the subjects, such as the minimization of the chip area, the minimization of the wiring length and the like, when the LSI of large size and high function is attained. There may be various methods as the automatic arrangement method. Roughly, there are a configuration arrangement method at an initial arrangement and a repeatedly improving method in an arrangement improvement. For example, there are a pair linking method, a cluster development method and a min-cut method as the configuration arrangement method at the initial arrangement.

Next, the wiring layout between the cells arranged by referring to the terminal name and the signal name noted in the circuit connection information is carried out at a step S102 of FIG. 8. This wiring process is carried out by considering a limit from a manufacturing process (the number of wiring layers, a design standard and the like), a limit of a delay time from an LSI operation speed, a power supply wiring impedance and the like. Since the number of wirings is very large in the actual computer process, it is treated in the roughly two stages of a global wiring and a detail wiring. When the automatic wiring is ended, the generation of a layout pattern 124 of a desirable semiconductor integrated circuit is ended.

After that, a mask pattern is generated in accordance with the generated layout 124. The generated mask pattern is sent to a post-process for manufacturing a semiconductor.

Various modifications will become possible for those skilled in the art after receiving the teachings of the present disclosure without departing from scope thereof.

What is claimed is:

1. A standard cell having a plurality of MOS transistors formed on a semiconductor substrate, on which a plurality of standard cells are adjacent to each other in upper, lower, left and right directions and constitute a semiconductor integrated circuit, the standard cell comprising:

(a) a boundary line between cells adjacent to each other; and (b) a special region, wherein the special region has at least one of a source region which is arranged beyond the boundary line and connected to a power source for applying a predetermined potential on the semiconductor substrate, and an empty space region arranged near the boundary line, in which when an adjacent cell has a source region beyond the boundary line, the source region of he adjacent cell can be mounted.

2. A standard cell of claim 1, further comprising a drain region arranged near the boundary line, wherein the drain region and the empty space region are arranged alongside of the boundary line.

3. A standard cell of claim 1, further comprising a drain region arranged near the boundary line,
   wherein the drain region is arranged near a center of the boundary line, and the source region is arranged near an end of the boundary line.

4. A standard cell of claim 1, further comprising a substrate contact region formed in the semiconductor substrate,
   wherein the substrate contact region and the source region are arranged such that the substrate contact region and the source region are overlapping.

5. A standard cell of claim 4, wherein the substrate contact region is formed in a well which is formed in the semiconductor substrate.

6. A standard cell of claim 4, wherein the substrate contact region and the source region are arranged in any of upper, lower, left and right areas of the standard cell.

7. A semiconductor integrated circuit having a standard cell configuration, comprising:
   (a) a substrate; and
   (b) a plurality of standard cells, each of which has a plurality of MOS transistors formed on the substrate, on which the standard cells are adjacent to each other in upper, lower, left and right directions and constitute the semiconductor integrated circuit,
   wherein each of the standard cells comprises:
      (i) a boundary line between cells adjacent to each other; and
      (ii) a special region,
         wherein the special region has at least one of a source region which is arranged beyond the boundary line and connected to a power source for applying a predetermined potential on the semiconductor substrate, and
         an empty space region arranged near the boundary line, in which when the adjacent cell has a source region beyond the boundary line, the source region of the adjacent cell can be mounted.

8. A semiconductor integrated circuit of claim 7,
   wherein the standard cell further has a drain region arranged near the boundary line, and
   the drain region and the empty space region are arranged alongside of the boundary line.

9. A semiconductor integrated circuit of claim 7,
   wherein the standard cell further has a drain region arranged near the boundary line, and
   the drain region is arranged near a center of the boundary line, and the source region is arranged near an end of the boundary line.

10. A semiconductor integrated circuit of claim 7,
   wherein the standard cell further has a substrate contact region formed in the semiconductor substrate, and
   the substrate contact region and the source region are arranged such that the substrate contact region and the source region are overlapping.

11. A semiconductor integrated circuit of claim 10, wherein the substrate contact region is formed in a well which is formed in the semiconductor substrate.

12. A semiconductor integrated circuit of claim 10, wherein the substrate contact region and the source region are arranged in any of upper, lower, left and right areas of the standard cell.

13. A semiconductor integrated circuit having a standard cell configuration, comprising:
   (a) a substrate; and
   (b) a plurality of standard cells, each of which has a plurality of MOS transistors formed on the substrate, on which the standard cells are adjacent to each other in upper, lower, left and right directions and constitute the semiconductor integrated circuit,
   wherein each of the standard cells further comprises:
      (i) a first cell having a source region which is arranged beyond a boundary line between the first cell and cells adjacent thereto and connected to a power supply for applying a predetermined potential on the semiconductor substrate;
      (ii) a second cell having an empty space region arranged near a boundary line between the second cell and cells adjacent thereto, in which when an adjacent cell has a source region beyond the boundary line, the source region of the adjacent cell can be mounted; and
      (iii) a third cell having both a source region which is arranged beyond a boundary line between the third cell and cells adjacent thereto and connected to a power supply for applying a predetermined potential on the semiconductor substrate, and an empty space region arranged near the boundary line, in which when an adjacent cell has a source region beyond the boundary line, the source region of the adjacent cell can be mounted.

14. A semiconductor integrated circuit of claim 13,
   wherein each of the second and third cells further has a drain region arranged near the boundary line, and
   the drain region and the empty space region are arranged alongside of the boundary line.

15. A semiconductor integrated circuit of claim 13,
   wherein each of the first and third cells further has a drain region arranged near the boundary line, and
   the drain region is arranged near a center of the boundary line, and the source region is arranged near an end of the boundary line.

16. A semiconductor integrated circuit of claim 13,
   wherein each of the first and third cells further has a substrate contact region formed in the semiconductor substrate, and
   the substrate contact region and the source region are arranged such that the substrate contact region and the source region are overlapping.

17. A semiconductor integrated circuit of claim 16, wherein the substrate contact region is formed in a well which is formed in the semiconductor substrate.

18. A semiconductor integrated circuit of claim 16, wherein the substrate contact region and the source region are arranged in any of upper, lower, left and right areas of the first and third cells.

* * * * *

UNITED STATES PATENT AND TRADEMARK OFFICE
CERTIFICATE OF CORRECTION

PATENT NO.     : 6,410,972 B1
DATED          : June 25, 2002
INVENTOR(S)    : Sei et al.

It is certified that error appears in the above-identified patent and that said Letters Patent is hereby corrected as shown below:

<u>Column 10,</u>
Line 64, change "region of he" to -- region of the --.

Signed and Sealed this

Twenty-seventh Day of August, 2002

Attest:

JAMES E. ROGAN
Attesting Officer            Director of the United States Patent and Trademark Office